US009995460B2

(12) United States Patent
Verschuuren et al.

(10) Patent No.: US 9,995,460 B2
(45) Date of Patent: Jun. 12, 2018

(54) SOLID STATE ILLUMINATION DEVICE BASED ON NON-RADIATIVE ENERGY TRANSFER

(71) Applicant: KONINKLIJKE PHILIPS N.V., Eindhoven (NL)

(72) Inventors: Marcus Antonius Verschuuren, Eindhoven (NL); Manuela Lunz, Waalre (NL); Ke Guo, Amsterdam (NL); Gabriel Sebastian Lozano Barbero, Eindhoven (NL); Remco Van Brakel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 66 days.

(21) Appl. No.: 15/312,338

(22) PCT Filed: May 18, 2015

(86) PCT No.: PCT/EP2015/060821
§ 371 (c)(1),
(2) Date: Nov. 18, 2016

(87) PCT Pub. No.: WO2015/180976
PCT Pub. Date: Dec. 3, 2015

(65) Prior Publication Data
US 2017/0089546 A1 Mar. 30, 2017

(30) Foreign Application Priority Data
May 27, 2014 (EP) .................................. 14170061

(51) Int. Cl.
*G02F 1/03* (2006.01)
*G02F 1/07* (2006.01)
(Continued)

(52) U.S. Cl.
CPC ................... *F21V 9/30* (2018.02); *F21K 9/64* (2016.08); *F21V 9/16* (2013.01); *G02B 5/008* (2013.01);
(Continued)

(58) Field of Classification Search
CPC ..... F21V 9/30; F21V 9/16; F21V 9/40; F21V 9/08; F21K 9/64; G02B 5/008;
(Continued)

(56) References Cited

U.S. PATENT DOCUMENTS

| 7,999,353 B1 | 8/2011 | Odom et al. |
| 9,868,901 B2 * | 1/2018 | Arbell .................. C09K 11/883 |

(Continued)

FOREIGN PATENT DOCUMENTS

| EP | 2477240 A1 | 7/2012 |
| EP | 13179374.7 | 8/2013 |

(Continued)

OTHER PUBLICATIONS

Extended European Search Report dated Jul. 14, 2014, European Application No. 14170061.7, 8 pages.

(Continued)

*Primary Examiner* — Collin X Beatty

(57) ABSTRACT

There is provided an illumination device comprising: a wavelength converting layer comprising a photon emitting donor configured to absorb energy to reach an excited state, and a photon emitting acceptor; an energy source configured to provide energy to the donor such that the donor reach the excited state; wherein the donor and the acceptor are selected and arranged at a distance from each other such that non-radiative transfer of excitation energy from the donor to the acceptor occur, and wherein the acceptor is configured to emit a photon at a second wavelength after the transfer of energy; the illumination device further comprising a peri-
(Continued)

odic plasmonic antenna array, arranged on the substrate and embedded within the wavelength converting layer, and comprising a plurality of individual antenna elements arranged in an antenna array plane, the plasmonic antenna array being configured to support a first lattice resonance at the second wavelength, arising from coupling of localized surface plasmon resonances in the individual antenna elements to photonic modes supported by the system comprising the plasmonic antenna array and the wavelength converting layer, wherein the plasmonic antenna array is configured to comprise plasmon resonance modes such that light emitted from the plasmonic antenna array has an anisotropic angle distribution.

16 Claims, 3 Drawing Sheets

(51) Int. Cl.
*G02F 1/017* (2006.01)
*H01L 33/50* (2010.01)
*F21K 9/64* (2016.01)
*F21V 9/16* (2006.01)
*G02B 5/00* (2006.01)

(52) U.S. Cl.
CPC .......... *G02F 1/017* (2013.01); *G02F 1/01708* (2013.01); *H01L 33/502* (2013.01); *G02F 2001/01791* (2013.01)

(58) Field of Classification Search
CPC ... H01L 33/502; H01L 33/504; H01L 33/507; H01L 33/06; H01L 33/04; H01L 33/50; H01L 2933/0083; H01L 31/035218
USPC .................. 359/241, 298, 321; 977/773, 950
See application file for complete search history.

(56) References Cited

U.S. PATENT DOCUMENTS

| | | | |
|---|---|---|---|
| 2005/0285128 A1* | 12/2005 | Scherer | H01L 33/22 257/98 |
| 2007/0025673 A1* | 2/2007 | Bose | B82Y 10/00 385/129 |
| 2010/0021104 A1* | 1/2010 | Yamagiwa | B82Y 20/00 385/8 |
| 2013/0026506 A1* | 1/2013 | Arbell | C09K 11/02 257/88 |
| 2016/0047532 A1* | 2/2016 | Scholes | H05K 9/0094 250/458.1 |

FOREIGN PATENT DOCUMENTS

| | | |
|---|---|---|
| WO | 2011092646 A2 | 8/2011 |
| WO | 2013166601 A1 | 11/2013 |

OTHER PUBLICATIONS

EPO as ISA, "International Search Report and Written Opinion" dated Jul. 22, 2015 from International Application No. PCT/EP2015/060821, filed May 18, 2015, 10 pages.

* cited by examiner

SOLID STATE ILLUMINATION DEVICE BASED ON NON-RADIATIVE ENERGY TRANSFER

CROSS-REFERENCE TO RELATED APPLICATIONS

The present application is a § 371 application of International Application No. PCT/EP2015/060821 filed on May 18, 2015 and entitled "SOLID STATE ILLUMINATION DEVICE BASED ON NON-RADIATIVE ENERGY TRANSFER," which claims the benefit of European Patent Application No. 14170061.7, filed May 27, 2014. PCT/EP2015/060821 and EP 14170061.7 are incorporated herein.

FIELD OF THE INVENTION

The present invention relates to an illumination device. In particular, the present invention related to an illumination device having improved emission properties.

BACKGROUND OF THE INVENTION

For light emitting diodes (LEDs) for use in lighting applications, it is desirable to provide essentially white light having a color temperature approximately comparable to that produced by incandescent lighting.

White light from LEDs is commonly provided by using a pn-diode emitting blue light, having a wavelength around 450 nm, where part of the blue light is converted to longer wavelengths using one or more wavelength converting materials arranged on top of, in the vicinity of, or at a distance from the diode. By combining the converted light with the unabsorbed blue light, a reasonably broadband spectrum which is perceived as white light can be obtained.

Currently, in most commercial applications, the wavelength converting material is applied directly on the LED. Furthermore, the wavelength converting material should be scattering in order to obtain a low variation in color over angle. This means that blue light will also be scattered back into the diode which leads to absorption losses in the LED. Moreover, the active component of the wavelength converting material, commonly phosphor, is an isotropic emitter, meaning that the same amount of wavelength converted light is emitted in all directions. This leads to further losses as only a portion of the light escapes through the output surface of the light emitting device.

The problem of reducing losses has for example been addressed by using a phosphor which is less scattering to reduce the amount of blue light which is backscattered and absorbed by the diode. However, the isotropic emission from the phosphor remains.

The amount of light leaving the light emitting device may also be increased by introducing a photonic band gap material in which the emission direction can be modified. However, to be able to control the emission direction, a photonic band gap material needs to be made from materials having a high refractive index contrast, high aspect ratio holes or pillars must be patterned and formed, the size control is very strict and the material must be luminescent which will incur scattering losses. Furthermore, a photonic band gap material is only really effective in the plane perpendicular to the surface of the material, i.e. in a direction parallel to the holes or pillars.

Accordingly, the suggested approaches for increasing the emission efficiency of a light emitting device suffer from inherent drawbacks which are hard to overcome.

SUMMARY OF THE INVENTION

In view of the above-mentioned desired properties of a light emitting device, and the above-mentioned and other drawbacks of the prior art, it is an object of the present invention to provide an improved light emitting device.

According to a first aspect of the invention, an illumination device is provided comprising: a wavelength converting layer comprising a photon emitting donor configured to absorb energy to reach an excited state, and a photon emitting acceptor; an energy source configured to provide energy to the donor such that the donor reaches the excited state; wherein the donor and the acceptor are selected and arranged at a distance from each other such that non-radiative transfer of excitation energy from the donor to the acceptor occurs, and wherein the acceptor is configured to emit a photon at a second wavelength after the transfer of energy; the illumination device further comprising a periodic plasmonic antenna array, embedded within the wavelength converting layer, and comprising a plurality of individual antenna elements arranged in an antenna array plane, the plasmonic antenna array being configured to support a first lattice resonance at the second wavelength, arising from coupling of localized surface plasmon resonances in the individual antenna elements to photonic modes supported by the system comprising the plasmonic antenna array and the wavelength converting layer, wherein the plasmonic antenna array is configured to comprise plasmon resonance modes such that light emitted from the plasmonic antenna array has an anisotropic angle distribution.

The field of plasmonics refers to the interaction of small conducting structures, typically metal structures, with light, whereby the size of the metal structures is similar to the wavelength of the light. The conduction electrons in the metal respond to an external electric field and the electron cloud oscillates at the driving optical frequency, leaving behind a more positive charged area, which pulls back the electrons. Due the small size of the metal structures, the resonances can reach the frequencies of visible light. As a result, a metal structure can have a large scatter cross-section which allows a strong interaction with any light that is incident on the metal particles or with any light that is generated in close proximity to the metal particles.

It has been found that regular arrays exhibit strong enhancement in directionality of the emission which is attributed to hybrid coupled Localized Surface Plasmon Resonance (LSPR) and photonic modes, also referred to as hybrid lattice plasmonic photonic modes, or plasmonic-photonic lattice resonances. The directionality enhancement of the emission is herein referred to as anisotropic emission, i.e. non-Lambertian emission.

Ordered arrays of optical antennas support collective resonances. When the wavelength of the radiation is in the order of the periodicity of the array, a diffracted order can radiate in the plane of the array. In this way the localized surface plasmon polaritons sustained by the individual particles may couple via diffraction leading to collective, lattice-induced, hybrid photonic-plasmonic resonances known as surface lattice resonances (SLRs). These delocalized modes extend over several unit cells, making it possible to obtain a collective enhancement of the emission from emitters distributed over large volumes as it is required in solid-state lighting.

Here, use is made of periodic arrays of nanoparticles that behave as collective nano-antennas. These arrays sustain collective plasmonic resonances. On the one hand, metallic nanoparticles have large scattering cross sections that allow resonant excitation of phosphors in the wavelength converting material, thereby enhancing the conversion of light. On the other hand, collective plasmonic resonances enable shaping the angular pattern of the emission, beaming most of the light into a very narrow angular range in a defined direction at a certain wavelength range. Therefore, the directional enhancement is explained as the combination of an increased efficiency in the excitation of the wavelength converting medium and an enhancement of the out-coupling efficiency of the emission of the phosphors to extended plasmonic-photonic modes in the array and the subsequent out-coupling to free-space radiation.

The periodic plasmonic antenna array may, for example, be formed on a substrate, after which it may or may not be arranged on the substrate in a final device. The wavelength converting layer comprising the antenna array may, for example, be provided on its own, or it may be arranged on a suitable energy source.

A more detailed description of the function and configuration of the plasmonic antenna array can be found in WO2012/098487 and in unpublished European patent application EP13179374.

The present invention is based on the realization that an anisotropic light distribution can be achieved by configuring a plasmonic antenna array such that it supports resonance modes and arranging a photon emitter in close proximity to the antenna array.

In a device comprising wavelength converting particles, e.g. phosphors, it has been found that the overall quantum efficiency of a plasmonic based wavelength converting layer can be largely improved by increasing the extinction coefficient of the wavelength converting layer. The extinction coefficient may for example be increased by increasing the concentration of the wavelength converting material, which may be generally referred to as phosphor. There is however a limit on how much the concentration of the phosphor may be increased before the internal quantum efficiency of the phosphor starts to drop due to quenching, which in turn reduces the overall quantum efficiency of the device.

In view of this, the inventors have further realized that the overall quantum efficiency of the device may be increased by providing a wavelength converting system in the form of a donor and an acceptor where non-radiative energy transfer takes place from the donor to the acceptor, and where a photon is subsequently emitted by the acceptor. Thereby, the photon of the second wavelength emitted by the acceptor is emitted by the coupled system comprising the acceptor and the antenna array.

Energy is provided to the donor from an external energy source to cause the donor to reach an excited state, which is discussed in detail below.

The majority of energy absorbed by the donor can be transferred to the acceptor and consequently, the emission spectrum of the donor-acceptor system is determined by the acceptor. The extinction coefficient is increased largely due to the increase in the number of absorbers. The quantum efficiency of this combined system is still high since the efficiency of the non-radiative energy transfer process is very high and no concentration quenching of the donor and acceptor is induced. The non-radiative energy transfer process is known as Förster resonance energy transfer (FRET), which is a mechanism describing energy transfer between a donor and an acceptor. FRET is based on transfer of energy via non-radiative dipole-dipole coupling, and the efficiency of the transfer is inversely proportional to the distance between the donor and the acceptor.

A donor/acceptor should in the present context be understood as any atom, molecule, particle or structure which is capable of being elevated in energy to an exited state through addition of energy, and where relaxation into a state of lower energy may take place through the emission of a photon. The donor and acceptor may also be referred to as photon emitters, or more generally as emitters. Accordingly, although the donor might be capable of emitting a photon, the donor instead transfers energy to the acceptor which in turn emits a photon, by means of the donor/acceptor arrangement. As the desirable wavelength of light emitted by the illumination device corresponds to the second wavelength, emitted by the acceptor, it is desirable to have a high transfer efficiency between the donor and the acceptor to suppress emission of photons from the donor, which have a shorter wavelength.

According to one embodiment of the invention, the acceptor may advantageously have a first energy level corresponding to said second wavelength and a second energy level higher than the first energy level, and the donor may have an energy level matching the second energy level of the acceptor. That the energy level of the donor is matching the energy level of the acceptor in general means that they are substantially the same. However, the energy levels may also be matching if there is a broad resonance of the donor level which overlaps the second energy level of the acceptor such that non-radiative energy transfer can occur. The energy levels are herein defined with respect to a common reference level $E_0$, and these are as such relative levels. Therefore, it can be understood that it is not the absolute energy levels of the material that are matched but the energy differences in the first and second energy level with respect to the "ground state" of either the donor or acceptor. The respective first and second energy level should thus be understood as the respective energy difference compared to the reference energy level $E_0$.

The donor is configured to reach an excited state when absorbing energy corresponding to the energy level in the donor. In a semiconductor, the energy level typically corresponds to the band gap, and the energy required to excite an electron from the valence band to the conduction band is at least equal to the band gap. In an embodiment, the acceptor has a first energy level corresponding to the wavelength of light to be emitted by the illumination device, and a second energy level, above the first energy level, i.e. above the conduction band for a semiconductor acceptor. Thereby, non-radiative energy transfer can occur between the excited donor, having an energy corresponding to the band gap of the donor, and the second energy level of the acceptor. After the energy transfer has taken place, the excited acceptor may relax down to the first energy level before radiative recombination occurs from the conduction band to the valence band, such that a photon is emitted. The same reasoning applies if the donor and acceptor are organic semiconductors, where the valence band is referred to as highest occupied molecular orbital (HOMO) and the conduction band corresponds to the lowest unoccupied molecular orbital (LUMO), and the band gap as the HOMO-LUMO gap. In principle, for FRET to take place the emission spectrum of the donor must overlap the absorption spectrum of the acceptor.

In one embodiment of the invention, the donor concentration and acceptor concentration are advantageously selected such that the non-radiative transfer of excitation energy from the donor to the acceptor has an efficiency higher than 0.9. It is desirable that as much as possible of the light emitted from the illumination device has a wavelength corresponding to the wavelength of photons emitted by the acceptor, which in turn couple to the plasmonic antenna array to achieve anisotropic emission of light of the desired wavelength. Thus, a high efficiency of non-radiative energy transfer means that radiative recombination from the donor is suppressed. In general, the efficiency of non-radiative transfer depends on the average distance between donors and acceptors, which in turn is a function of the donor and acceptor concentration in the wavelength converting layer for a given donor/acceptor combination. In the case of an efficiency higher than 0.9, and in an embodiment higher than 0.95, very little or no donor emission will be detectable and the shape of the emission spectrum will completely resemble that of the acceptor.

According to one embodiment of the invention, a ratio between a donor concentration and an acceptor concentration is at least 1:1. The ratio may for example be in the range of 1:1 to 5:1. The optimum donor/acceptor ratio is determined in part by the acceptor concentration which should not be too high as quenching of the acceptor quantum efficiency can reduce the overall system efficiency when the acceptors are too close to each other. Increasing the donor concentration in relation to the acceptor concentration enhances the absorption in the wavelength converting layer. However, the maximum donor/acceptor ratio can be limited as it may be detrimental if donors start to be too close to each other. To determine an optimum ratio, the lifetime of the acceptor excited state and the time for non-radiative transfer must also be taken into consideration. In general, when a donor is excited and ready to transfer energy, there must be an available acceptor in the ground state ready to receive the energy.

In one embodiment of the invention, the donor and acceptor may advantageously be point emitters selected from the group comprising rare earth ions, dye molecules and quantum dots. In principle any point emitter where excitation may result in the emission of a photon may be used in the present context, and the point emitter may be selected based on the desirable wavelengths and material properties of the application at hand.

According to one embodiment of the invention, the donor may advantageously be a dye molecule or quantum dot emitting green/yellow light having wavelengths from 500 to 580 nm. Moreover, the acceptor may advantageously be a dye molecule or quantum dot emitting red light having wavelengths from 580 to 630 nm. A high extinction coefficient can be achieved by combining two highly efficiently coupled dyes based on FRET. The two dyes are a green dye that absorbs blue light and emits green light and a red dye that absorbs blue and green light and emits red light. Due to the overlap of the emission spectrum of the green dye and the absorption spectrum of the red dye, a strong FRET can occur from the green dye molecules to the red dye molecules as they are mixed in the same wavelength converting layer. The majority of energy absorbed by the green dye molecules can be transferred to the red dye molecules and consequently, the emission spectrum of the combined system of the two dyes is determined by the red dye. The extinction coefficient is largely increased due to the increase in the number of absorbers. The quantum efficiency of this combined system is still high (close to 1) since the FRET efficiency is very high and no quenching of the green and red dye is induced.

According to one embodiment of the invention, the donor and/or the acceptor may advantageously be a perylene dye molecule. Perylene based dye molecules are known in the field of wavelength conversion for light emitting diodes, and it has been found that a combination of two different perylene based dye molecules provide a high FRET efficiency and a high extinction coefficient. Other types of dyes may also be used such as dyes based on CdSe, ZnSe, InP QDs and the like.

In one embodiment of the invention, the donor and acceptor concentration are advantageously selected such that the resulting extinction coefficient and quantum efficiency of the wavelength converting layer comprising the plasmonic antenna array is higher than for a wavelength converting layer comprising only one of the donor and the acceptor and a similar overall extinction. The extinction coefficient and the quantum efficiency of a wavelength converting layer coupled to a plasmonic antenna array are determined by the concentration of the wavelength converting particles. However, as a general principle, the quantum efficiency decreases as the extinction coefficient increases as a result of quenching due to the increasing concentration of wavelength converting particles. It is thus desirable to achieve the advantageous effects of the coupled donor-acceptor system without introducing drawbacks related to a too high concentration of wavelength converting particles.

According to one embodiment of the invention, the illumination device may further comprise an energy source configured to provide energy to the donor such that the donor reaches the excited state. The energy provided to the donor must be equal to or higher than the energy level of the donor typically corresponding to the band gap or the HOMO-LUMO gap. The donor may also comprise additional energy levels higher than the first energy level, such that the donor may more easily absorb energies larger than the band gap. In principle any external energy source may be used to excite the point emitter, such as a photon or electron having sufficiently high energy, i.e. higher than the first energy level, x-ray or gamma radiation, heat, injection of electron-hole pairs etc.

Moreover, the energy source may for example be a photon emitter, an electron emitter, an x-ray emitter, a gamma-ray emitter or an electron-hole pair. Electrons may for example be emitted by a cathode ray tube (CRT), x-rays/gamma-rays may for example be provided from a vacuum tube, gamma ray (CT).

In one embodiment of the invention the photon emitter may advantageously be a light emitting diode or a solid state laser. Semiconductor based photon emitters are commonly used and may be easily integrated with the abovementioned illumination device.

According to one embodiment of the invention, the plasmonic antenna array may advantageously be configured to comprise plasmon resonance modes being out-of plane asymmetric. By configuring the plasmonic antenna array to provide an asymmetric emission of light, more of the light emitted by the antenna array can be emitted towards the emitting surface of the illumination device. This leads to an increased overall efficiency of the illumination device since a larger portion of the generated light is emitted from the selected light emitting surface of the device. The illumination device can be configured so that light is primarily emitted either through the substrate or from the wavelength converting layer away from the substrate. Out-of plane asymmetric plasmon resonance modes may for example be achieved by making the antenna elements asymmetric, for example having the shape of a pyramid, a truncated pyramid, a cone or a truncated cone. Thereby, the resulting resonant modes for each antenna element become asymmetric which in turn leads to asymmetric light emission properties. The asymmetric shape of the antenna element refers to the asymmetry of a cross section of such an element in a plane parallel to the longitudinal axis of the antenna element, i.e. cross section in a vertical plane of a "standing" antenna element.

The tapering of the antenna element is important for the asymmetry of the emission. In particular, the asymmetry is based on the simultaneous excitation of electric and magnetic resonances in the antenna elements. As will be further explained below, it is mainly the magnetic and magneto-electric (cross-coupled) response which is enhanced by the broken symmetry. The magnetic response is the response of the antenna element to the magnetic field of the incident light, whereas magneto-electric refers to the excitation of electric fields by incident magnetic fields, and vice versa.

It is known from electrodynamics that a single electric dipole coupled to a single magnetic dipole can tailor the forward/backward scattering ratio depending on the relative phase of the dipoles. Typically, most materials do not have a magnetic response at optical frequencies, so the effect is hardly found for light. However, metallic nanostructures can be designed to sustain magnetic excitations of strength comparable to their electric ones. Moreover, these two different excitations may cross-couple, leading to a magneto-electric response.

Increasing the tapering of the antenna elements, where tapering refers to the ratio of the diameter or side at the base to the diameter or side at the top, increases both the magnetic and the magneto-electric response. Thus, by increasing the tapering, the two responses are increased and an antenna array exhibiting an increased asymmetry can be designed. It is also noted that the asymmetry of emission from these structures relies on these having electric and magnetic excitations of similar amplitudes.

According to one embodiment of the invention, the antenna array may advantageously comprise a plurality of truncated pyramidal antenna elements having a top side in the range of 110 to 130 nm, a bottom side in the range of 135 to 155 nm, and a height in the range of 140 to 160 nm, and wherein the antenna elements are arranged in a square array having a lattice constant of about 400 nm. The sides are referred to as the sides of a rectangle or square or triangle. In general, with reference to the aforementioned size ranges, arrays based on smaller antenna elements are resonant towards the blue end of the visible spectrum in comparison to larger antenna elements which are resonant towards the red end of the visible spectrum. The total size of the antenna element is of importance for the localized plasmon resonance. The base and top support localized modes, where a difference in size of top and bottom broaden the combined local resonance of the antenna. There are different resonances for top and bottom of a truncated antenna element, and the top and bottom resonances can couple to each other. Then, the height of the antenna element will introduce a phase delay and govern the coupling of the resonances, thereby determining the asymmetry of the emission, partly due to retardation partly due to electro and magnetic resonances.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing embodiments of the invention.

DETAILED DESCRIPTION

Figure 1:
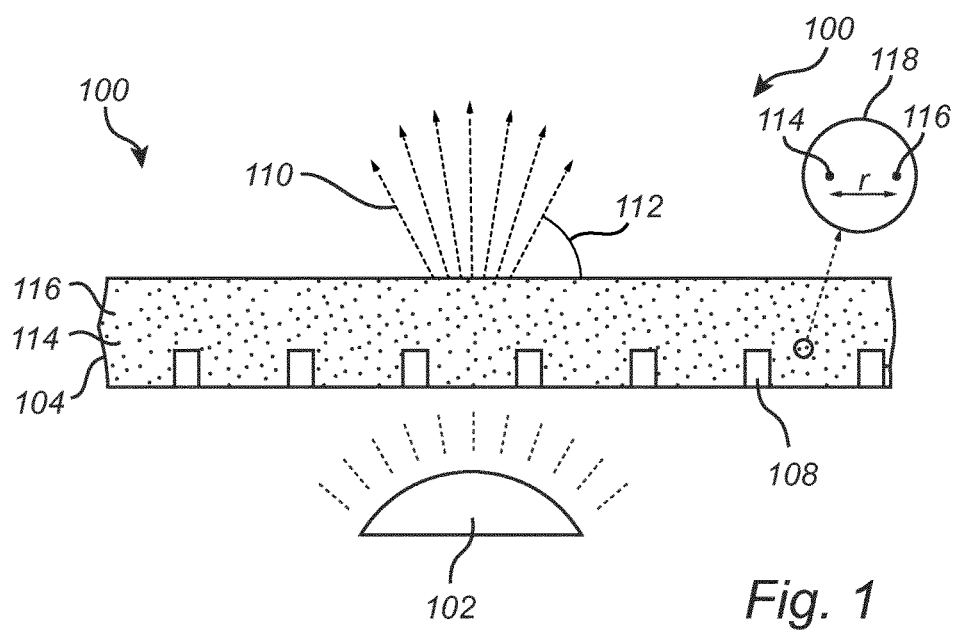
FIG. 1 schematically illustrates an illumination device according to an embodiment of the invention.

The present invention will now be described more fully hereinafter with reference to the accompanying drawings, in which exemplary embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1 is a schematic illustration of an illumination device 100 comprising a wavelength converting layer 104 comprising a plurality of donor 114 and acceptor 116 particles arranged in close proximity of a periodic plasmonic antenna array comprising a plurality of individual antenna elements 108 arranged in an antenna array plane defined as the plane of the base of the antenna elements. The donor 114 and acceptor 116 may also be referred to as fluorescent materials, photon emitters, emitters, phosphors or dyes. The donor 114 and acceptor 116 may for example be rare earth ions, dye molecules, quantum dots, or a combination thereof.

The external energy source 102 for exciting the donor may for example be a photon emitter such as a light emitting diode or a laser. Even though the main purpose of the energy source 102 is to excite the donor 114, it is in some cases unavoidable that also the acceptor 114 is excited. In principle any external energy source may be used to excite the donor, such as an electron having sufficiently high energy, x-ray or gamma radiation, heat, injection of electron-hole pairs etc. Electrons may for example be emitted by a cathode ray tube (CRT), x-rays/gamma-rays may for example be provided from a vacuum tube, gamma ray (CT). For simplicity, and to explain the general concept using photons to stimulate the donor, the energy source will henceforth be referred to as a light source 102. Herein, the light source 102 is illustrated as a separately arranged light emitting device, such as a light emitting diode or a laser, arranged at a distance from the wavelength converting layer and from the remainder of the illumination device. However, the light source 102 may equally well be integrated such as in a semiconductor light emitting diode formed in a semiconductor substrate, where the antenna array and the wavelength converting layer is formed on top of the substrate.

FIG. 1 further illustrate that the donors 114 are arranged in the wavelength converting layer 104 adjacent to the light source 102 to receive energy from the energy source 102 such that the donors 114 may absorb energy and reach an excited state.

The zoomed in portion of FIG. 1 illustrates a donor 114 separated from an acceptor 116 by a distance r. The efficiency of non-radiative energy transfer from the donor to the acceptor is inversely proportional to the distance r.

Figure 2:
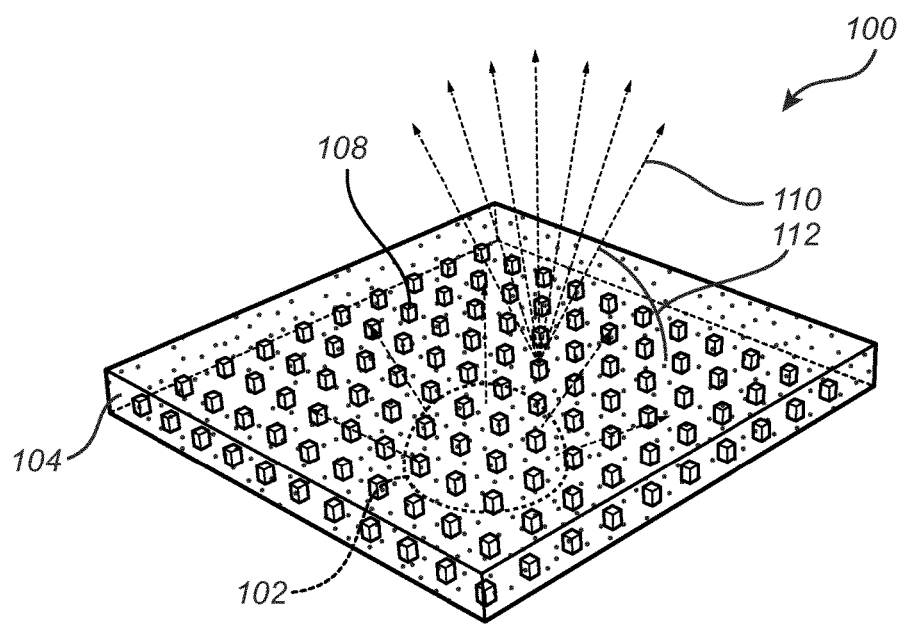
FIG. 2 schematically illustrates an illumination device according to an embodiment of the invention.

FIG. 2 further illustrates a periodic plasmonic antenna array comprising a plurality of individual antenna elements 108 arranged in an antenna array plane. The antenna array is arranged within the wavelength converting layer 104. Furthermore, the antenna array is configured to support lattice resonances at the second wavelength, corresponding to the wavelength of light emitted by the acceptor 116, arising from diffractive coupling of localized surface plasmon resonances in the individual antenna elements. It is further illustrated in FIGS. 1 and 2 how light 110 is emitted from a light emitting surface of the illumination device 100 within a limited angular range 112, i.e. an anisotropic distribution of the emitted light.

Figure 3:
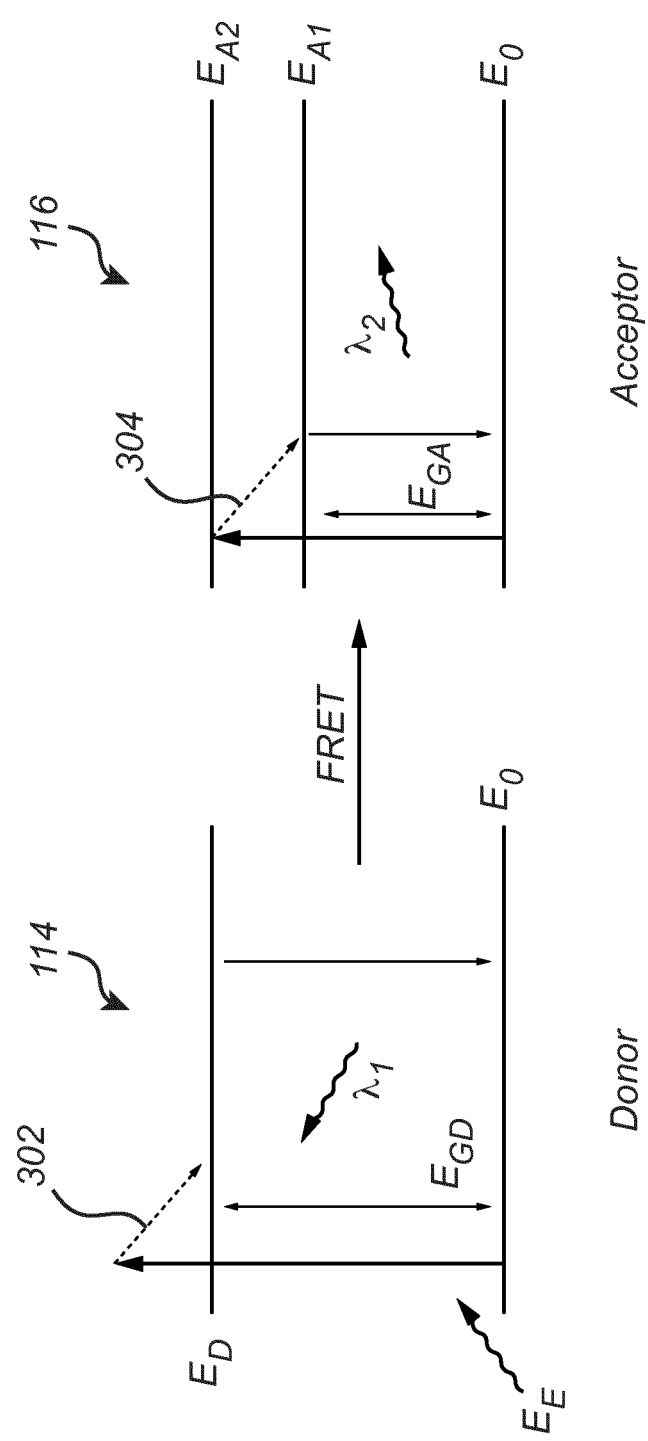
FIG. 3 schematically illustrates an energy band diagram of photon emitters in an illumination device according to an embodiment of the invention.

FIG. 3 is a schematic illustration of energy band diagrams of the donor 114 and the acceptor 116 used to explain the concept of non-radiative energy transfer, in particular Förster resonance energy transfer (FRET) and the respective energy levels of the donor 114 and the acceptor 116. The terminology for energy levels in a semiconductor is used herein, where the energy band gap $E_G$ is defined by the difference between the valence band and the conduction band. However, the reasoning may be applied analogously to organic semiconductors where the valence band corresponds to highest occupied molecular orbital (HOMO) and the conduction band corresponds to the lowest unoccupied molecular orbital (LUMO), and the band gap as the HOMO-LUMO gap.

The donor 114 has a first energy level $E_D$ here corresponding to the donor band gap $E_{GD}$. A photon emitted by the light source (or another energetic particle emitted by another energy source), having an energy $E_E$ higher than $E_D$, is absorbed by the donor such that the donor reaches an excited state. Typically, when the photon absorbed by the donor has an energy higher than $E_D$, the donor relaxes 302 to reach an excited state having the energy $E_D$, from which a photon having a first wavelength $\lambda_1$ can be emitted if the donor relaxes to the ground state by way of direct recombination. Once the donor is in an excited state having an energy $E_D$, energy is transferred non-radiatively via FRET to the acceptor which has an energy level $E_{A2}$ corresponding to $E_D$. After the acceptor has been excited, it relaxes 304 down to the lower energy level $E_{A1}$ after which a photon having the second wavelength $\lambda_2$ is emitted via recombination when the acceptor relaxes to the ground state. As the band gap of the acceptor, $E_{GA}$, is smaller than $E_{GD}$, energy is lost in the wavelength conversion process such that the wavelength $\lambda_2$ is longer than the wavelength $\lambda_1$, and also longer than the wavelength of light absorbed by the donor. Thereby, for example blue light emitted by the light source 102 is shifted towards the red portion of the visible spectra. Any light emitted by the donor through direct recombination over the band gap $E_{GD}$ will be of the first wavelength $\lambda_1$. As the donor for example may be a dye molecule emitting in the green/yellow wavelength range and the acceptor may be a dye molecule emitting in the red wavelength range, it is desirable to suppress emission of light directly from the donor, i.e. to have a FRET efficiency which is as high as possible. An increased FRET efficiency for a specific donor acceptor combination is achieved by tailoring the distance between donors and acceptors, by controlling the concentration of donor and acceptors in the wavelength converting layer 104, such that the average distance between a given type of donor and acceptor is suitable for FRET.

For a single donor and a single acceptor, the FRET efficiency $E_{FRET}$ can be calculated by $$E_{FRET} = \frac{1}{1 + \left[\left(\frac{R_0}{r}\right)^6\right]^{-1}}$$

where it can be seen that in addition to the so called Förster radius $R_0$, a number characterizing the probability for FRET between specific types of donor and acceptors, the efficiency of the transfer process depends strongly on the separation r between the donor and acceptor.

In a layer as discussed here, many donors and acceptors are distributed randomly in a 3D space. Hence, to calculate the FRET efficiency for a specific donor, one has to take into account all the acceptors labeled i at a separation $r_i$, with which the donor can interact, as shown by $$E_{FRET} = \frac{1}{1 + \left[\Sigma_i\left(\frac{R_0}{r_i}\right)^6\right]^{-1}}.$$

As the exact position of acceptors with respect to each donor is not known, the acceptor concentration $c_{ACC}$ can be used to describe the probability to find an acceptor at a certain distance to the donor rather than including the exact separation between donor and acceptor. In this way the FRET efficiency for a three-dimensional arrangement as a function of acceptor concentration $c_{Acc}$ can be calculated by comparing the intensity or number of photons emitted by the donor in the presence ($I_{DA}$) and the absence ($I_D$) of acceptors:

$$E_{FRET} = 1 - \frac{I_{DA}}{I_D} = 1 - \frac{\int I_D^0 \exp\left[-t/\tau_D - 2\gamma(t/\tau_D)^{\frac{1}{2}}\right]dt}{\int I_D^0 \exp[-t/\tau_D]dt} \text{ with}$$

$$\gamma = \frac{\Gamma\left(\frac{1}{2}\right)}{2}\frac{c_{Acc}}{c_0} \text{ and } c_0 = \left(\frac{4}{3}\pi R_0^3\right)^{-1}$$

To calculate the intensities $I_{DA}$ and $I_D$, the donor intensity decays are integrated over time, indicated by t. $I_D^0$ denotes the donor intensity or photon count measured at time 0 and $\tau_D$ is the characteristic decay time or lifetime of the donor in absence of the acceptors. Furthermore, $$\Gamma\left(\frac{1}{2}\right) = \sqrt{\pi}$$

is the Gamma function and $c_0$ describes a characteristic concentration for which a spherical volume with radius $R_0$ contains on average 1 acceptor. At this concentration $c_0$ a FRET efficiency of 72.38% is obtained.

In order to use FRET as a mechanism to increase the absorption in a wavelength converting layer 104, e.g. for applications with plasmonics, but without altering the resulting emission spectrum, the FRET efficiency has to be high, such as at least 0.9, in embodiments higher than 0.95 or in other embodiments higher than 0.98. In this case very little or no donor emission will be detectable and the shape of the emission spectrum from the illumination device will completely resemble that of the acceptor. To achieve such high FRET efficiencies at reasonable acceptor concentrations (e.g. about 0.03 acceptors/nm³ corresponding to an average acceptor separation of 4.0 nm), donor-acceptor combinations with a relatively high Förster radius should be used, in an embodiment a Förster radius of 3.0 nm or higher. The acceptor concentration should not be too high as quenching of the acceptor quantum efficiency can reduce the overall system efficiency when the acceptors are too close to each other. In order to achieve relevant Förster efficiencies of about 0.95, a minimum acceptor concentration of 0.0295/nm$^3$ for $R_0$=3.0 nm, corresponding to an average acceptor separation of 4.0 nm, should be realized.

Furthermore, in order to significantly enhance the absorption in the wavelength converting layer 104 the ratio of donors to acceptors should be at least 1:1, however higher ratios such as 4:1 or 5:1 would be even more beneficial. The maximum ratio can however be limited by the size of the donors and acceptors as it might be detrimental if donors start to be too close to each other and depending on the acceptor excited state lifetime and acceptor concentration, which determines the time that an acceptor is in a ground state and responsive to FRET.

Moreover, a high concentration of donors would lead to a high absorbance around the pump wavelength, corresponding to the energy $E_E$, which reduces the excitation of acceptors with high energy photons, which is favorable for the long term stability of the acceptor. However, a too high donor concentration may lead to saturation of the acceptors. Here, the coupling between the acceptor and plasmonic modes of the antenna array provides an additional advantage as the coupling reduces the excited state lifetime of the acceptor. Thus, it is desirable to have a donor concentration as high as possible without donor-donor interaction (e.g. concentration quenching).

Additionally, the donor 114 is in embodiments configured such that an absorption band of the donor is capable of absorbing incident light within an energy range above the band gap, so that as much as possible of the incident light is absorbed. This is for example achieved through additional energy levels located above the conduction band energy level $E_D$, or LUMO-level in the case of an organic molecule.

In principle, the above described wavelength converting layer may be provided in combination with one or more additional wavelength converting layers, with or without plasmonic antenna arrays.

Figure 4:
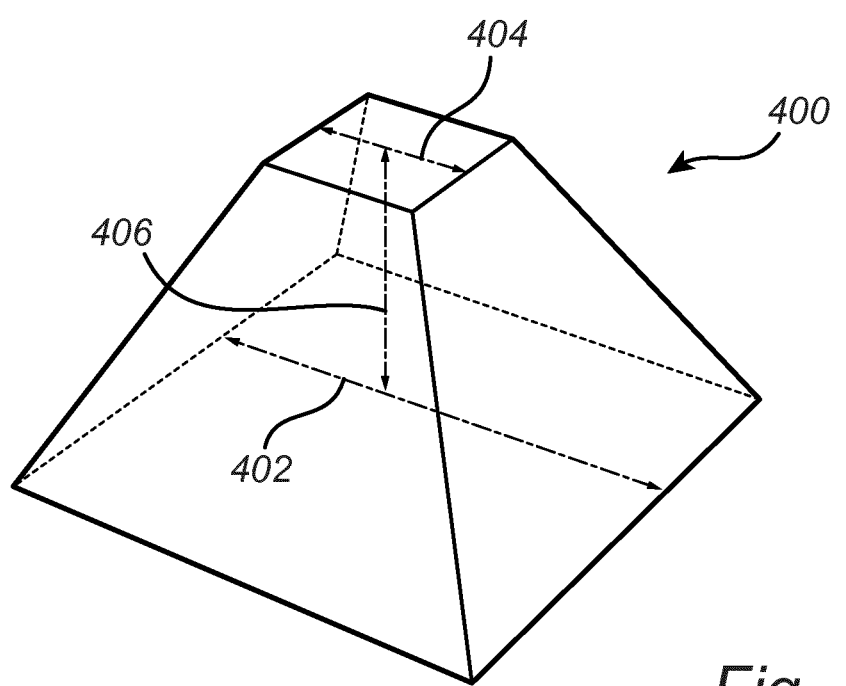
FIG. 4 schematically illustrates an antenna element of an illumination device according to an embodiment of the invention.

In an example embodiment, a plasmonic antenna array configured to support plasmonic-photonic lattice resonances at a frequency range corresponding to red light may for example comprise antenna elements in the form of truncated pyramidal antenna elements 400 as illustrated in FIG. 4, having a top side 404 in the range of 110 to 130 nm, a bottom side 402 in the range of 135 to 155 nm, and a height 406 in the range of 100 to 160 nm. The sides are in this example the lengths of the sides of a square, but rectangles or triangles are also possible. Moreover, the antenna elements are arranged in a square array having a lattice constant of about 400 nm. Also a hexagonal array with a period of 470 nm will exhibit near normal enhanced emission.

The antenna element may for example be made from aluminum fabricated on a fused silica substrate. The wavelength converting layer can for example be a polystyrene material comprising donor and acceptor particles spin-coated onto the substrate.

Additionally, variations to the disclosed embodiments can be understood and effected by the skilled person in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

What is being claimed is:

1. An illumination device comprising:
a wavelength converting layer comprising:
a donor configured to absorb energy to reach an excited state, and to emit light of a first wavelength, and
an acceptor configured to emit light of a second wavelength, longer than the first wavelength, wherein the donor and the acceptor are selected and arranged at a distance from each other such that non-radiative transfer of excitation energy from the donor to the acceptor occurs such that the acceptor emits a photon at the second wavelength after the transfer of excitation energy, and;
a periodic plasmonic antenna array embedded within the wavelength converting layer, wherein:
the plasmonic antenna array comprises a plurality of individual antenna elements arranged in an antenna array plane,
the plasmonic antenna array is configured to support a first lattice resonance at the second wavelength, arising from coupling of localized surface plasmon resonances in the individual antenna elements to at least one photonic resonance mode by combining the plasmonic antenna array and the wavelength converting layer, and
light emitted from the plasmonic antenna array has an anisotropic angle distribution.

2. The illumination device of claim 1, wherein the acceptor has a first energy level ($E_{A1}$) corresponding to the second wavelength and a second energy level ($E_{A2}$) higher than the first energy level, and the donor has an energy level ($E_D$) matching the second energy level ($E_{A2}$) of the acceptor.

3. The illumination device of claim 1, wherein a donor concentration and an acceptor concentration are selected such that the non-radiative transfer of excitation energy from the donor to the acceptor has an efficiency higher than 0.9.

4. The illumination device of claim 1, wherein a ratio between a donor concentration and an acceptor concentration is at least 1-to-1.

5. The illumination device of claim 1, wherein a ratio between a donor concentration and an acceptor concentration is in a range of about 1-to-1 to about 5-to-1.

6. The illumination device of claim 1, wherein the donor and the acceptor are point emitters selected from at least one of a set of rare earth ions, a set of dye molecules, and a set of quantum dots.

7. The illumination device of claim 6, wherein the donor is a dye molecule or quantum dot emitting green/yellow light having wavelengths from about 500 nm to about 580 nm.

8. The illumination device of claim 6, wherein the acceptor is a dye molecule or quantum dot emitting red light having wavelengths from about 580 nm to about 630 nm.

9. The illumination device of claim 6, wherein at least one of the donor and the acceptor is a perylene dye molecule.

10. The illumination device of claim 1, wherein a donor concentration and an acceptor concentration are selected such that at least one of an extinction coefficient and a quantum efficiency of the wavelength converting layer is higher than for a wavelength converting layer comprising substantially only the acceptor.

11. The illumination device of claim 1, further comprising an energy source configured to provide energy to the donor such that the donor reaches the excited state.

12. The illumination device of claim 11, wherein the energy source is at least one of a photon emitter, an electron emitter, an x-ray emitter, a gamma-ray emitter, and an electron-hole pair.

13. The illumination device of claim 11, wherein the energy source is at least one of a light emitting diode and a solid state laser.

14. The illumination device of claim 1, wherein the plasmonic antenna array is configured to comprise at least one plasmon resonance mode being out-of plane asymmetric.

15. The illumination device of claim 1, wherein a plurality of antenna elements that form the plasmonic antenna array are arranged in a substantially square array having a lattice constant of about 400 nm, or a substantially hexagonal array with a lattice constant of 470 nm.

16. The illumination device of claim 1, wherein the plasmonic antenna array comprises:
- a plurality of truncated pyramidal antenna elements having a top side width in a first range of about 110 nm to about 130 nm,
- a bottom side width in a second range of about 135 nm to about 160 nm, and
- a height in a third range of about 100 nm to about 160 nm.

* * * * *